US008610609B2

(12) United States Patent
Ginetti (10) Patent No.: US 8,610,609 B2
(45) Date of Patent: Dec. 17, 2013

(54) NMOS BUFFER FOR HIGH-SPEED LOW-RESOLUTION CURRENT STEERING DIGITAL-TO-ANALOG CONVERTERS

(75) Inventor: Bernard Ginetti, Antibes (FR)

(73) Assignee: MStar Semiconductor, Inc. (TW)

( * ) Notice: Subject to any disclaimer, the term of this patent is extended or adjusted under 35 U.S.C. 154(b) by 7 days.

(21) Appl. No.: 13/423,061

(22) Filed: Mar. 16, 2012

(65) Prior Publication Data

US 2013/0063292 A1 Mar. 14, 2013

Related U.S. Application Data

(60) Provisional application No. 61/532,670, filed on Sep. 9, 2011.

(51) Int. Cl.
*H03M 1/00* (2006.01)

(52) U.S. Cl.
USPC ............................................ 341/136; 341/144

(58) Field of Classification Search
USPC ............. 341/136, 144, 110, 150, 126; 327/65
See application file for complete search history.

(56) References Cited

U.S. PATENT DOCUMENTS 6,326,913 B1 * 12/2001 Chao et al. .................... 341/144

* cited by examiner

*Primary Examiner* — Joseph Lauture
(74) *Attorney, Agent, or Firm* — Han IP Corporation (57) ABSTRACT

The present disclosure provides techniques for using an NMOS field effect transistor-based buffer to buffer a pair of complementary digital signals and output a pair of equivalently fast rising and fast falling complementary signals to simultaneously drive a differential pair of PMOS transistors of a unit cell that output an analog signal for a current steering DAC. Accordingly, a DAC comprises a latch circuit and a unit cell circuit. The latch circuit includes an NMOS field effect transistor-based buffer and is capable of receiving a first digital signal and a clock signal and outputting a second digital signal through the NMOS field effect transistor-based buffer according to the clock signal. The second digital signal is associated with the first digital signal. The unit cell circuit, coupled to the latch circuit, receives the second digital signal and outputs an analog signal representative of the first digital signal.

12 Claims, 5 Drawing Sheets

NMOS BUFFER FOR HIGH-SPEED LOW-RESOLUTION CURRENT STEERING DIGITAL-TO-ANALOG CONVERTERS

CROSS-REFERENCE TO RELATED APPLICATION

This application claims the priority benefit of U.S. Patent Application Ser. No. 61/532,670, filed on Sep. 9, 2011, the entirety of which is incorporated herein by reference.

BACKGROUND

1. Technical Field

The present disclosure relates to digital-to-analog converters (DACs) and, more particularly, to high-speed low-resolution current steering DACs.

2. Description of Related Art

With the rise of the digital age, large amounts of information are transferred and stored in the form of digital signals over wired and wireless networks for a wide variety of applications. Such applications include, for example, digital television, streaming multimedia on a wireless device, online gaming, etc. Although signals are easily stored and transmitted in digital form, conversion of digital signals to analog signals is necessary for recognition by human senses or other non-digital systems.

With recent TV broadcasting technology evolutions, in some television broadcasting systems, TV signals are carried in different high frequency bands. TV modulators and demodulators need to support multiple carrier frequencies. In fact, pixel carriers may fall from several tens to several hundreds of MHz. Considering the situation when the first harmonic of the lowest frequency carrier may fall not far away enough from the highest carrier, a sharp reconstruct filter is desired. As a result, a more efficient DAC structure for this range of signal frequencies is current steering DAC. This is why current steering DACs tend to have higher speed and lower resolution in the digital-to-analog conversion. A current steering DAC may utilize one current source, for each bit of a digital code to be converted by the DAC, to provide a precise current or voltage to a summing point. These precise currents or voltages are summed up at the summing point to provide a converted analog signal. However, as high-precision current sources tend to be expensive, a hybrid approach, in which thermometric decoder and an array of 2n–1 identical unit cells are utilized for an n-bit digital code to be converted, is gaining popularity. This configuration tends to provide improved differential nonlinearity and minimized glitch energy.

For example, an 8-bit DAC may have an 8-bit thermometric decoder with each one of its 255 output bits controlling a unit current source. Accordingly, latching the thermometric code locally at the input of each unit cell is necessary for a number of reasons. First, there is basically no way to guarantee simultaneous settling of all 255 decoder's outputs across the unit cell array that would result in clock phase modulation with signal amplitude. Second, the usual two-step decoding of input code (row and column signals, locally AND-ORed) may result in clock feed-through even when a unit cell is not supposed to change state, and this may cause possible large glitches when row and column signals are misaligned. Third, it is imperative that the total logic delay between a clock source and the output of the unit cells be minimized in order to reduce variations across the cell array (due to mismatch) and across time (due to device noise) that would result in jitter. A conventional current steering DAC may include a thermometric decoder, 2n–1 latches and 2n–1 unit current cells, with each latch latching a respective thermometric code and driving the differential pair of p-type metal-oxide-semiconductor (PMOS) field effect transistors of the respective unit current cell to provide output analog signals outp and outn.

Figure 5:
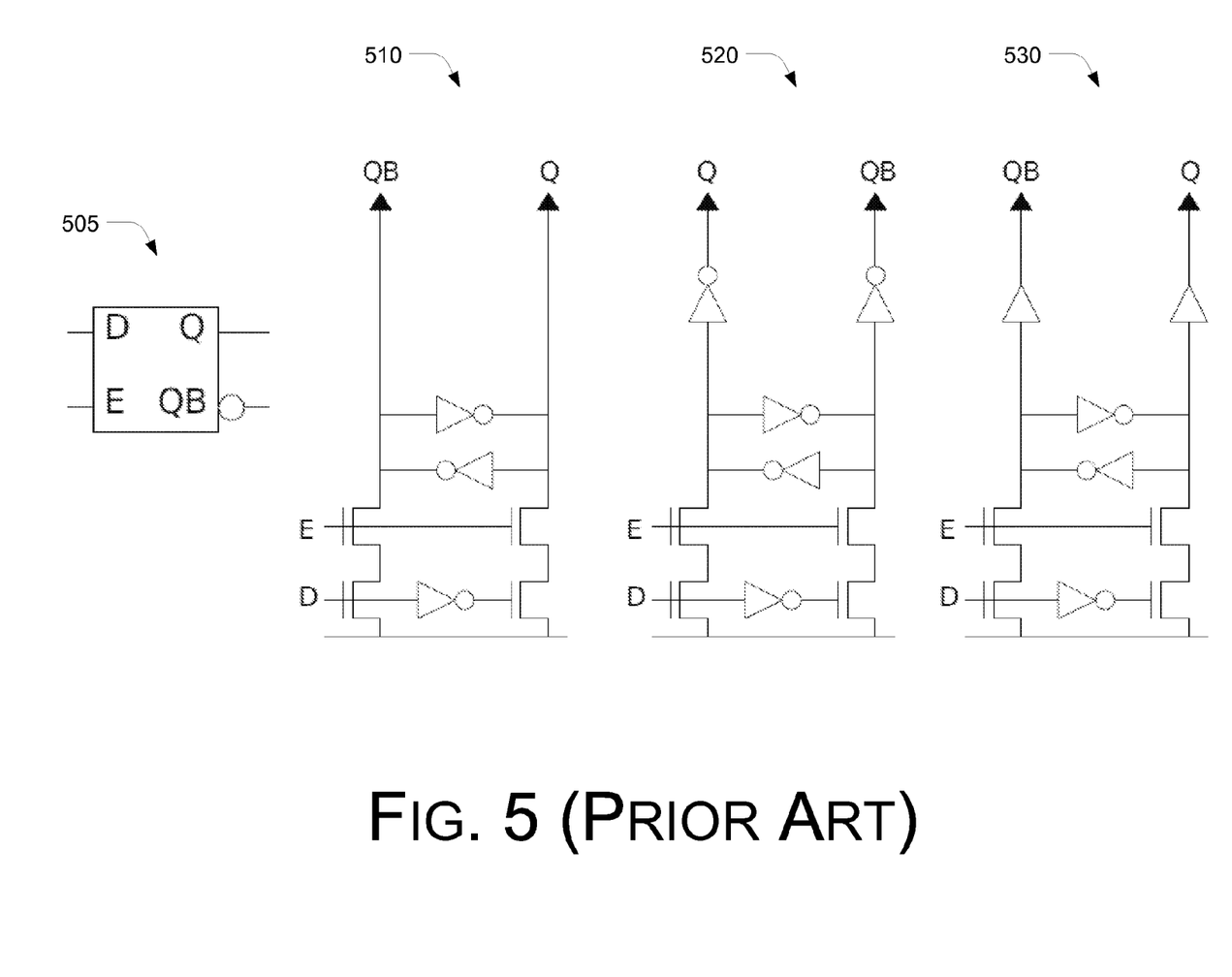
FIG. 5 is a schematic diagram of conventional un-buffered and buffered latches.

FIG. 5 depicts a gated D latch 505 which is typically used in conventional current steering DACs. FIG. 5 also illustrates a conventional latch 510, which is the schematic diagram of the latch 505. The latch 505 features inherent symmetry as needed for balanced enabling an disabling switching of the transistors in a respective unit current cell, provided that input signal D is settled before the enable signal E, e.g., a clock signal, is rising. The latch 505 outputs signals Q and QB feature in an inherent 'break-before-make' nature in that the falling of one output, e.g., pulled down by the left or right n-type metal-oxide-semiconductor (NMOS) field effect transistor stack, before the other output is rising so that both outputs Q and QB will cross each other at a low trip-point voltage. This ensures that, during the switching of the unit current cell, current is always flowing through the differential pair of PMOS transistors in the unit current cell. This in turn minimizes the occurrence of glitch, and prevents desaturation in cascades of PMOS transistors M2 and M1, and hence the long recovery that would result.

However, latch in the conventional current steering DAC still suffer from at least an issue of the output rising edge being inherently slow. Referring to the schematic diagram of the latch 510, PMOS transistors of the output inverters need to be weak enough, i.e., weaker than the NMOS transistors in the NMOS stack of the latch 510 that fight against the PMOS transistors during switching, and this is especially critical in the case of slow NMOS transistors/fast PMOS transistors. The aforementioned low trip-point voltage is achieved after some significant delay. On the one hand, the NMOS stack cannot pull one of the output voltage levels down to zero as long as the other output voltage level has not risen high enough so that an opposite PMOS transistor is turned off. This is slowing down the end of the falling edge of the pull-downed voltage level significantly. On the other hand, the rising edge is slow due to the PMOS transistors being purposely made weak. The trip point is reached as both output voltage levels change very slowly, and the actual value and timing of the trip point tend to vary not insignificantly between the unit current cells due to device mismatch.

Moreover, direct loading of latches, such as the latch 510, is undesirable. When the loading is above certain loading threshold, buffers may be used. Buffering the outputs of the latch may result in faster and smaller latch, lower power consumption, and minimized width of tail current peak. FIG. 5 also illustrates a latch 520 with a single-stage, and hence inverting, buffer. FIG. 5 further illustrates a latch 530 with a double-stage, and hence non-inverting, buffer.

With the latch 520, the inherent 'break-before-make' nature in the direct outputs of the latch 520 will result in the outputs Q and QB of the single-stage buffer having a 'make-before-break' nature: as a result, current would transiently stop from flowing in the unit cell at each switching, creating large glitches. To get the wanted 'break-before-make' nature after the inverting buffers, the latch itself should have a 'make-before-break' nature: this could be achieved with simply using the CMOS-complementary version of latch 520, depicted on Figure X. However, it is highly undesirable to use such version X, as it would entail forcing the NMOS transistor in each of the cross-coupled inverters with two PMOS in series. PMOS being about 4 times weaker than NMOS, this would result in about 4 time higher load on clock signal EB to get the same switching speed.

With the latch 530, the load threshold in order for such implementation to be a solution preferred over the latch 510 would be much higher. Thus, it is not practical to use the buffered latch 530.

SUMMARY

The present disclosure provides techniques for using an NMOS field effect transistor-based buffer to buffer a pair of complementary digital signals and output a pair of equivalently fast rising and fast falling complementary signals to simultaneously drive a differential pair of PMOS transistors of a unit cell that output an analog signal for a current steering DAC.

According to one aspect, a DAC may comprise a latch circuit and a unit cell circuit. The latch circuit may comprise an NMOS field effect transistor-based buffer, and may be capable of receiving a first digital signal and a clock signal and outputting a second digital signal through the NMOS field effect transistor-based buffer according to the clock signal, with the second digital signal associated with the first digital signal. The unit cell circuit, coupled to the latch circuit, may receive the second digital signal and output an analog signal representative of the first digital signal.

In one embodiment, the latch circuit may comprise a latch that receives the first digital signal and the clock signal and outputs, according to the clock signal, the first digital signal and an inverse first digital signal that is an inverse of the first digital signal. The latch circuit may further comprise the NMOS field effect transistor-based buffer coupled to receive the first digital signal and the inverse first digital signal from the latch and output a buffered first digital signal and a buffered inverse first digital signal that is an inverse of the buffered first digital signal. One of the buffered first digital signal and the buffered inverse first digital signal may be the second digital signal.

In one embodiment, the NMOS field effect transistor-based buffer may comprise a first stack of NMOS transistors and a second stack of NMOS transistors. The first stack of NMOS transistors may include a first NMOS transistor and a second NMOS transistor coupled in series such that a drain terminal of the first NMOS transistor is connected to a source terminal of the second NMOS transistor, with a source terminal of the first NMOS transistor being coupled to the first voltage source and a drain terminal of the second NMOS transistor being coupled to the second voltage source. A voltage level of the first voltage source may be different from a voltage level of the second voltage source. The second stack of NMOS transistors may include a third NMOS transistor and a fourth NMOS transistor coupled in series where a drain terminal of the third NMOS transistor is connected to a source terminal of the fourth NMOS transistor, with a source terminal of the third NMOS transistor being coupled to the first voltage source and a drain terminal of the fourth NMOS transistor being coupled to the second voltage source. More specifically, a gate terminal of the first NMOS transistor and a gate terminal of the fourth NMOS transistor may be connected to each other and coupled to receive the inverse first digital signal from the latch. A gate terminal of the second NMOS transistor and a gate terminal of the third NMOS transistor may be connected to each other and coupled to receive the first digital signal from the latch. A first node may be coupled to a drain terminal of the first NMOS transistor and a source terminal of the second NMOS transistor to output the buffered first digital signal. A second node may be coupled to a drain terminal of the third NMOS transistor and a source terminal of the fourth NMOS transistor to output the buffered inverse first digital signal.

In one embodiment, the unit cell circuit may comprise a pair of differential PMOS field effect transistors, including a first PMOS transistor and a second PMOS transistor. The first PMOS transistor may include a source terminal coupled to a current source, a drain terminal coupled to a first load, and a gate terminal coupled to receive the buffered first digital signal. The second PMOS transistor may include a source terminal coupled to the current source, a drain terminal coupled to a second load, and a gate terminal coupled to receive the buffered inverse first digital signal.

In one embodiment, the DAC may further comprise a thermometric decoder circuit that receives an n-bit binary code to accordingly output the first digital signal to the latch circuit.

According to another aspect, a DAC may comprise a thermometric decoder circuit and a plurality of unit cell circuits. The thermometric decoder circuit may receive an n-bit binary code to accordingly output a plurality of digital signals representative of the n-bit binary code. At least one of the plurality of unit cell circuits may comprise a latch circuit and a pair of differential PMOS field effect transistors. The latch circuit may be coupled to receive clock signal and a respective one of the plurality of digital signals as a first digital signal. The latch circuit may include an NMOS field effect transistor-based buffer that outputs a buffered first digital signal and a buffered inverse first digital signal as an inverse of the buffered first digital signal, according to the clock signal. The pair of differential PMOS field effect transistors may include a first PMOS transistor switched on or off according to the buffered first digital signal and a second PMOS transistor switched on or off according to the buffered inverse first digital signal such that the pair of differential PMOS transistors output an analog signal representative of the respective one of the plurality of digital signals from the thermometric decoder circuit.

In one embodiment, the latch circuit may comprise a latch. The latch may receive the clock signal and the respective one of the plurality of digital signals from the thermometric decoder circuit as the first digital signal and output, according to the clock signal, the first digital signal and an inverse first digital signal that is an inverse of the first digital signal. The NMOS field effect transistor-based buffer, coupled to receive the first digital signal and the inverse first digital signal from the latch, may output a buffered first digital signal and a buffered inverse first digital signal that is an inverse of the buffered first digital signal. One of the buffered first digital signal and the buffered inverse first digital signal may be the second digital signal.

In one embodiment, the NMOS field effect transistor-based buffer may comprise a first stack of NMOS transistors and a second stack of NMOS transistors. The first stack of NMOS transistors may include a first NMOS transistor and a second NMOS transistor coupled in series where a drain terminal of the first NMOS transistor is connected to a source terminal of the second NMOs transistor, with a source terminal of the first NMOS transistor being coupled to the first voltage source and a drain terminal of the second NMOS transistor being coupled to the second voltage source. A voltage level of the first voltage source may be different from a voltage level of the second voltage source. The second stack of NMOS transistors may include a third NMOS transistor and a fourth NMOS transistor coupled in series where a drain terminal of the third NMOS transistor is connected to a source terminal of the fourth NMOS transistor, with a source terminal of the third NMOS transistor being coupled to the first voltage source and a drain terminal of the fourth NMOS transistor being coupled to the second voltage source. More specifically, a gate terminal of the first NMOS transistor and a gate terminal of the fourth NMOS transistor may be connected to each other and coupled to receive the inverse first digital signal from the latch. A gate terminal of the second NMOS transistor and a gate terminal of the third NMOS transistor may be connected to each other and coupled to receive the first digital signal from the latch. A first node may be coupled to a drain terminal of the first NMOS transistor and a source terminal of the second NMOS transistor to output the buffered first digital signal. A second node may be coupled to a drain terminal of the third NMOS transistor and a source terminal of the fourth NMOS transistor to output the buffered inverse first digital signal.

According to a further aspect, a DAC may comprise a unit cell, a latch circuit, and a buffering circuit. The unit cell may include a pair of differential PMOS field effect transistors coupled between a current source and a load. The pair of differential PMOS transistors may include a first PMOS transistor and a second PMOS transistor such that when the first and second PMOS transistors are driven by a pair of complementary signals the pair of differential PMOS transistors outputs a corresponding analog signal. The latch circuit may receive and latch a digital signal and output, according to a clock signal, a pair of complementary digital signals corresponding to the latched digital signal. The buffering circuit, coupled between the latch circuit and the pair of differential PMOS transistors, may buffer the pair of complementary digital signals and output a pair of equivalently fast rising and fast falling complementary signals that simultaneously drive the first and second PMOS transistors and output the analog signal.

In one embodiment, the buffering circuit may comprise an NMOS field effect transistor-based buffer that buffers the pair of complementary digital signals from the latch circuit and outputs the pair of equivalently fast rising and fast falling complementary signals.

In one embodiment, the NMOS field effect transistor-based buffer may comprise a first stack of NMOS transistors and a second stack of NMOS transistors. The first stack of NMOS transistors may include a first NMOS transistor and a second NMOS transistor coupled in series and between a first voltage source and a second voltage source. A voltage level of the first voltage source may be different from a voltage level of the second voltage source. The second stack of NMOS transistors may include a third NMOS transistor and a fourth NMOS transistor coupled in series between the first voltage source and the second voltage source. A source terminal of the first NMOS transistor may be coupled to the first voltage source and a drain terminal of the second NMOS transistor may be coupled to the second voltage source. A source terminal of the third NMOS transistor may be coupled to the first voltage source and a drain terminal of the fourth NMOS transistor may be coupled to the second voltage source. A gate terminal of the second NMOS transistor and a gate terminal of the third NMOS transistor may be cross-connected and coupled to receive a first digital signal of the pair of complementary digital signals from the latch. A gate terminal of the first NMOS transistor and a gate terminal of the fourth NMOS transistor may be cross-connected and coupled to receive an inverse first digital signal of the pair of complementary digital signals from the latch. A first node may be coupled to a drain terminal of the first NMOS transistor and a source terminal of the second NMOS transistor to output a buffered first digital signal of the pair of equivalently fast rising and fast falling complementary signals. A second node may be coupled to a drain terminal of the third NMOS transistor and a source terminal of the fourth NMOS transistor to output a buffered inverse first digital signal of the pair of equivalently fast rising and fast falling complementary signals.

In one embodiment, the latch circuit may comprise a gated D latch.

In one embodiment, the DAC may further comprise a thermometric decoder circuit that receives an n-bit binary code and outputs the digital signal to the latch circuit.

This Summary is submitted with the understanding that it will not be used to interpret or limit the scope or meaning of the claims. This Summary is not intended to identify key features or essential features of the claimed subject matter, nor is it intended to be used as an aid in determining the scope of the claimed subject matter.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION OF PREFERRED EMBODIMENTS

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, may be arranged, substituted, combined, separated, and designed in a wide variety of different configurations, all of which are explicitly contemplated herein.

Exemplary Buffered Latch and Current Steering DAC

Figure 1:
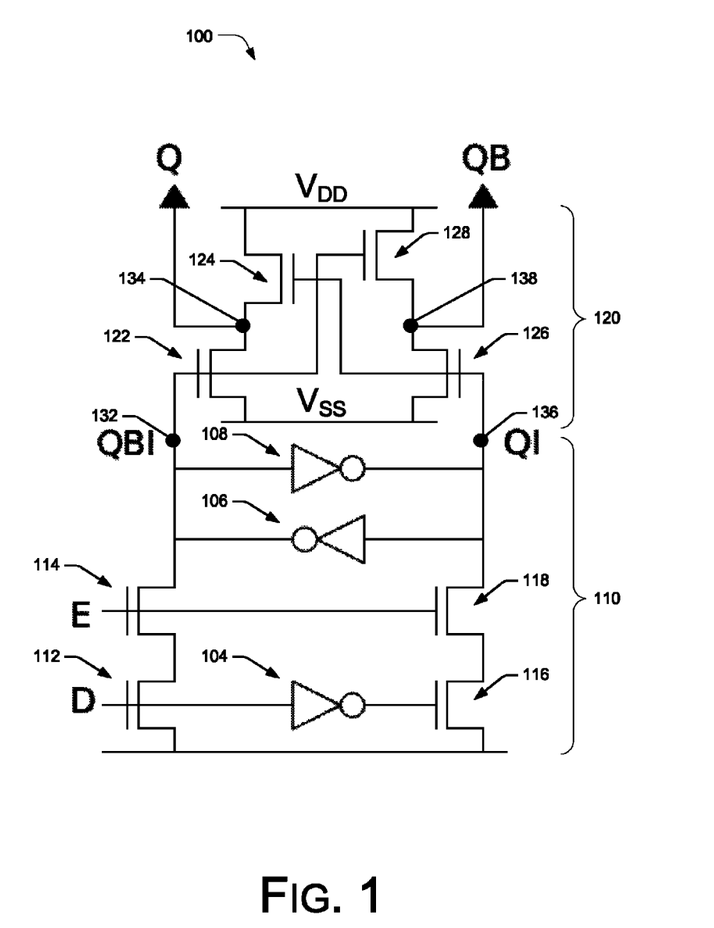
FIG. 1 is a schematic diagram of a latch circuit having a latch buffered by a NMOS field effect transistor-based buffer in accordance with an embodiment of the present disclosure.
Figure 2:
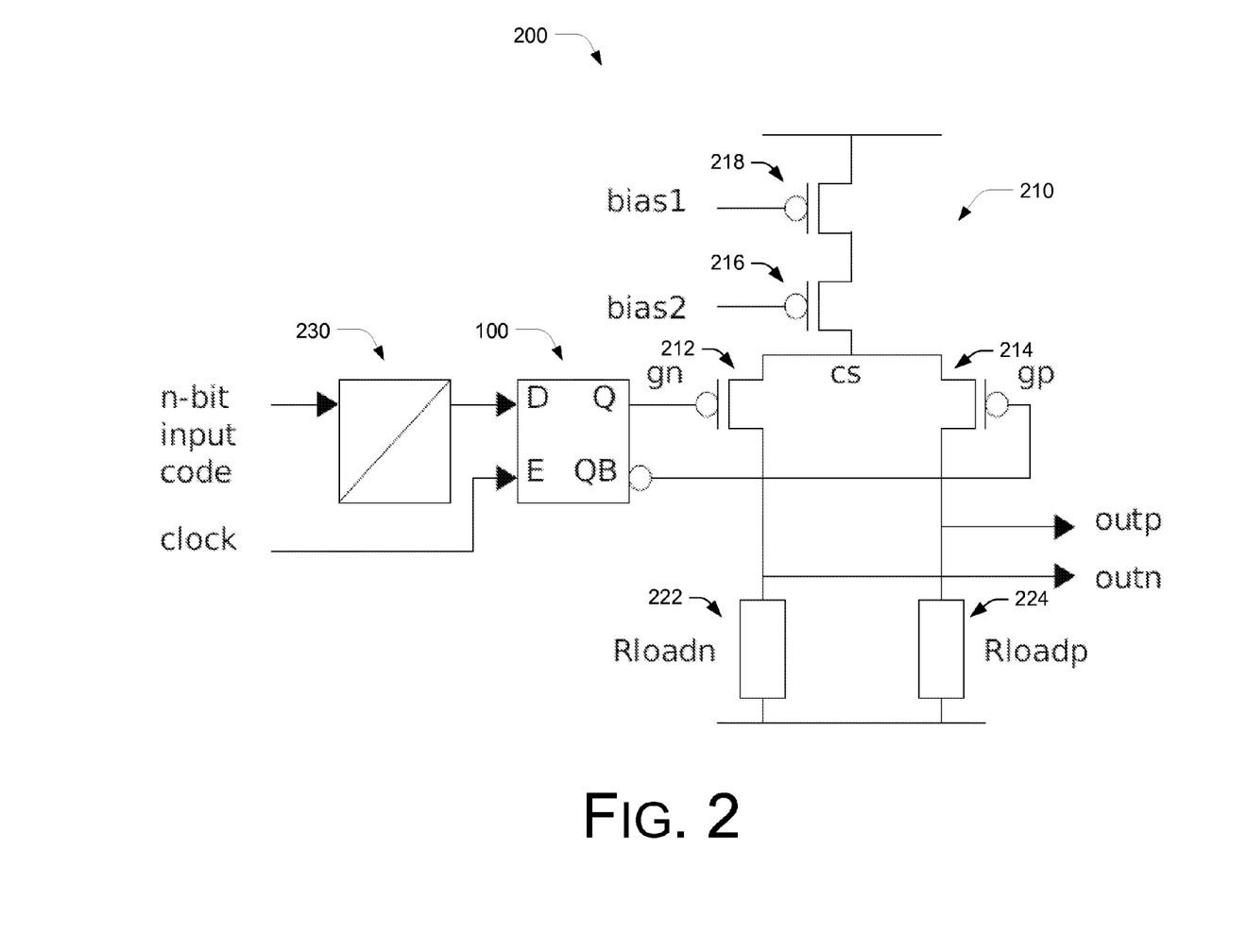
FIG. 2 is a block diagram of a current steering DAC utilizing the latch circuit of FIG. 1 in accordance with an embodiment of the present disclosure.

FIG. 1 illustrates a latch circuit 100 having a latch 110 buffered by a NMOS field effect transistor-based buffer 120 in accordance with an embodiment of the present disclosure. FIG. 2 illustrates a current steering DAC 200 utilizing the latch circuit 100 of FIG. 1 in accordance with an embodiment of the present disclosure. The detailed description that follows refers to FIGS. 1 and 2.

The latch 110 may be a gated D latch. In other embodiments, the latch 110 may be a suitable latch of one of the other types of latches. As shown in FIG. 1, the latch 110 includes an NMOS stack having an NMOS transistor 112 and another NMOS transistor 114 coupled in series. The latch 110 also includes another NMOS stack having an NMOS transistor 116 and another NMOS transistor 118 coupled in series. The latch 110 further includes inverters 104, 106 and 108 coupled in a way as shown in FIG. 1. As gated D latches are well known in the art, detailed description of the structure and operation of the latch 110 is not provided herein in the interest of brevity. Briefly, the latch 110 receives a first digital signal D and a clock signal E and, in turn, outputs a pair of complementary intermediate signals QI and QBI with the intermediate signal QBI being an inverse of the intermediate signal QI.

The NMOS field effect transistor-based buffer 120 includes a first stack of NMOS transistors having a first NMOS transistor 122 and a second NMOS transistor 124 coupled in series between a first voltage source VSS and a second voltage source VDD. The NMOS field effect transistor-based buffer 120 further includes a second stack of NMOS transistors having a third NMOS transistor 126 and a fourth NMOS transistor 128 coupled in series between the first voltage source VSS and the second voltage source VDD. A voltage level of the first voltage source VSS is different from a voltage level of the second voltage source VDD. For example, the voltage level of the first voltage source VSS may be lower than the voltage level of the second voltage source VDD.

A source terminal of the first NMOS transistor 122 is coupled to the first voltage source VSS. A drain terminal of the second NMOS transistor 124 is coupled to the second voltage source VDD. A source terminal of the third NMOS transistor 126 is coupled to the first voltage source VSS. A drain terminal of the fourth NMOS transistor 128 is coupled to the second voltage source VDD. A gate terminal of the first NMOS transistor 122 and a gate terminal of the fourth NMOS transistor 128 are connected to each other and coupled to a node 132 to receive the intermediate signal QBI, which is the inverse first digital signal D, from the latch 110. A gate terminal of the second NMOS transistor 124 and a gate terminal of the third NMOS transistor 126 are connected to each other and coupled to a node 136 to receive the intermediate signal QI, which is the first digital signal D, from the latch 110. A node 134, coupled to a drain terminal of the first NMOS transistor 122 and a source terminal of the second NMOS transistor 124, outputs a buffer output signal Q, which is the buffered first digital signal D. A node 138, coupled to a drain terminal of the third NMOS transistor 126 and a source terminal of the fourth NMOS transistor 128, outputs a complementary buffer output signal QB, which is the buffered inverse first digital signal D.

In operation, assuming the first digital signal D has been changing from 0 to 1 and upon a rising edge of the clock signal E, the NMOS transistors 112, 114 are conducted which lead the drain terminal of the NMOS transistors 112, 114 conducted to ground and thus gate terminals of the first NMOS transistor 122 and the fourth NMOS transistor 128 are pulled to ground which cause the first NMOS transistor 122 and the fourth NMOS transistor 128 cease to conduct. This does not have any real effect on the intermediate signals QI and QBI because first NMOS transistor 122 and the fourth NMOS transistor 128 cut off conduction from VDD. Once the voltage level of the intermediate signal QBI has fallen low enough, the voltage level of the intermediate signal QI starts to rise to cause the third NMOS transistor 126 and the second NMOS transistor 124 to start conduction. Resultantly, the voltage level of the buffer output signal Q is pushed high towards the voltage level of the voltage source VDD with the second NMOS transistor 124 simultaneously as the voltage level of the complementary buffer output signal QB is pulled low with the third NMOS transistor 126 towards the voltage level of the first voltage source VSS. The 'break-before-make' nature of the latch 110 prevents any tail current in the first NMOS stack of the first NMOS transistor 122 and the second NMOS transistor 124 as well as in the second NMOS stack of the third NMOS transistor 126 and the fourth NMOS transistor 128. Unlike in conventional latches, the latch circuit 100 would not result in a fast enabling/slow disabling of the pair of differential PMOS transistors 212 and 214 of the unit current cell of FIG. 2. That is, as the NMOS field effect transistor-based buffer 120 is comprised of all NMOS transistors, the NMOS transistors 122, 124, 126 and 128 of the NMOS field effect transistor-based buffer 120 offer switching/conduction at a speed four times higher than that of PMOS transistors over a certain range. Advantageously, the latch circuit 100 allows the PMOS transistors 212 and 214 to be driven simultaneously with equivalently fast signals Q and QB on the gate terminal of the PMOS transistors 212 and 214, respectively. The trip point of the PMOS transistors 212 and 214 is close to the voltage level of the first voltage source VSS, and there is no need to pull any of the gate terminals of the PMOS transistors 212 and 214 up to the voltage level of the second voltage source VDD to ensure complete switching of the PMOS transistors 212 and 214. Consequently, the reduced swing advantageously results in lower glitch energy and lower power sunk from the voltage supply.

The current steering DAC 200 includes a unit cell 210 and the latch circuit 100. The unit cell 210 may be a unit current cell. As shown in FIG. 2, the unit cell 210 includes a pair of differential PMOS transistors 212 and 214. A source terminal of the PMOS transistor 212 is coupled to a common source node 'cs' to receive a current from a current source. A drain terminal of the PMOS transistor 212 is coupled to a first load 222. A gate terminal of the PMOS transistor 212 is coupled to receive the output signal Q (denoted as gn in FIG. 2), which is the buffered first digital signal D, from the latch circuit 100. A source terminal of the PMOS transistor 214 is coupled to the common source node 'cs'. A drain terminal of the PMOS transistor 214 is coupled to a second load 224. A gate terminal of the PMOS transistor 214 is coupled to receive the complementary output signal QB (denoted as gp in FIG. 2), which is the buffered inverse first digital signal D, from the latch circuit 100. The outputs of the PMOS transistors 212 and 214, e.g., differential output voltages, form an analog signal that is representative of the first digital signal D.

It is to be noted that, unlike in conventional latches, the latch circuit 100 in FIG. 2 would not result in a fast enabling/slow disabling of the pair of differential PMOS transistors 212 and 214 of the unit current cell. That is, as the NMOS field effect transistor-based buffer 120 includes all NMOS transistors, the NMOS transistors 122, 124, 126 and 128 of the NMOS field effect transistor-based buffer 120 offer faster switching/conduction, e.g., at a speed four time higher than that of PMOS transistors, over a certain range. Advantageously, the latch circuit 100 allows the PMOS transistors 212 and 214 to be driven simultaneously with equivalently fast signals Q and QB on the gate terminals of the PMOS transistors 212 and 214, respectively. The trip point of the PMOS transistors 212 and 214 is close to the voltage level of the first voltage source VSS, and there is no need to pull any of the gate terminals of the PMOS transistors 212 and 214 up to the voltage level of the second voltage source VDD to ensure complete switching of the PMOS transistors 212 and 214. Consequently, the reduced swing advantageously results in lower glitch energy and lower power sunk from the voltage supply.

In one embodiment, as shown in FIG. 2, the current steering DAC 200 may further include a thermometric decoder circuit 230. Accordingly, the current steering DAC 200 may correspondingly include 2n−1 latch circuits 100 and 2n−1 unit cells 210, with the thermometric decoder circuit 230 receiving an n-bit binary code and outputting a respective first digital signal D to each latch circuit 100 and each latch circuit 100, in turn, driving the differential pair of PMOS transistors 212 and 214 of the respective unit current cell 210.

Exemplary Simulated Results

Figure 3:
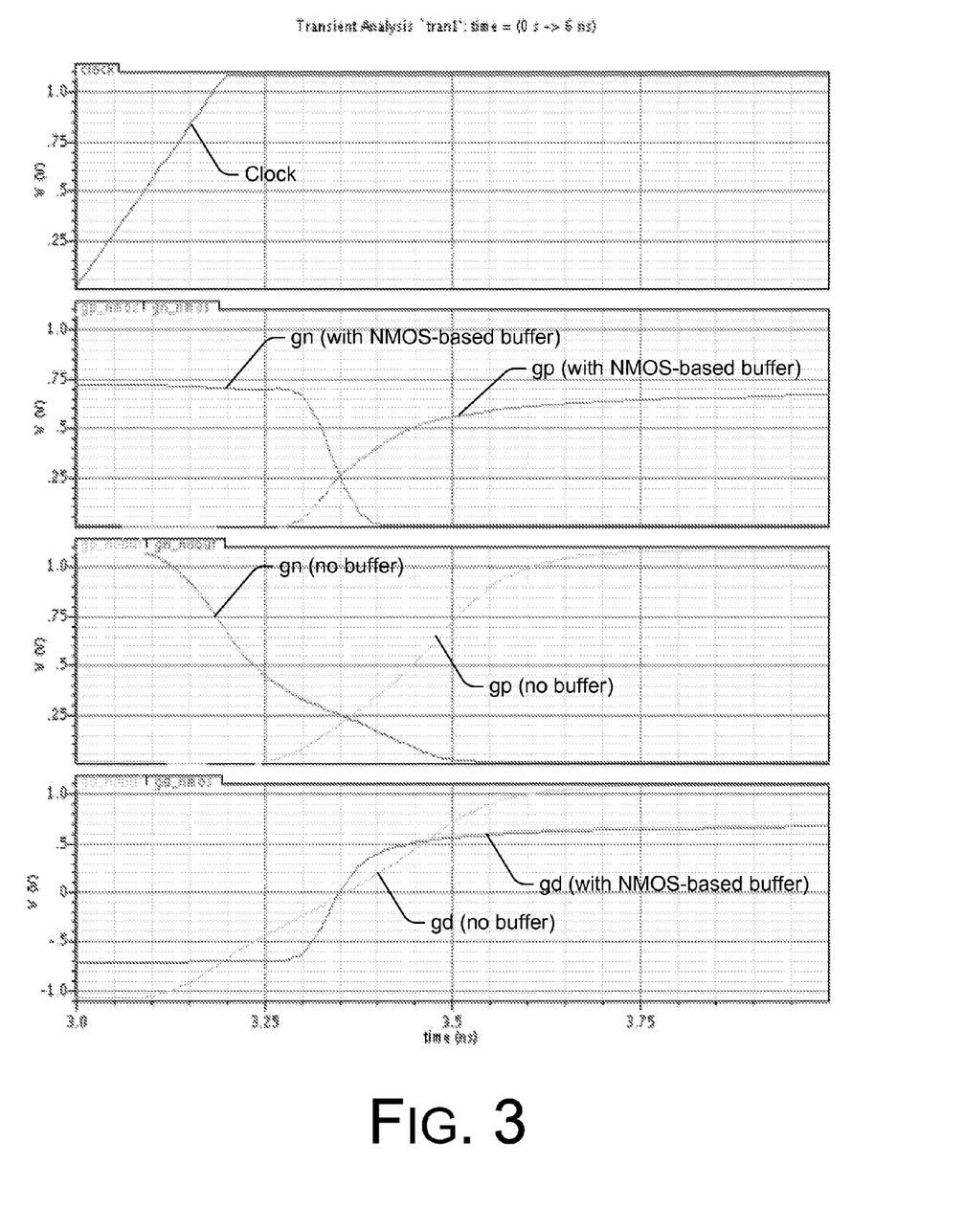
FIG. 3 is a timing diagram that shows a comparison of switching of an un-buffered latch and that of a buffered latch in accordance with an embodiment of the present disclosure.
Figure 4:
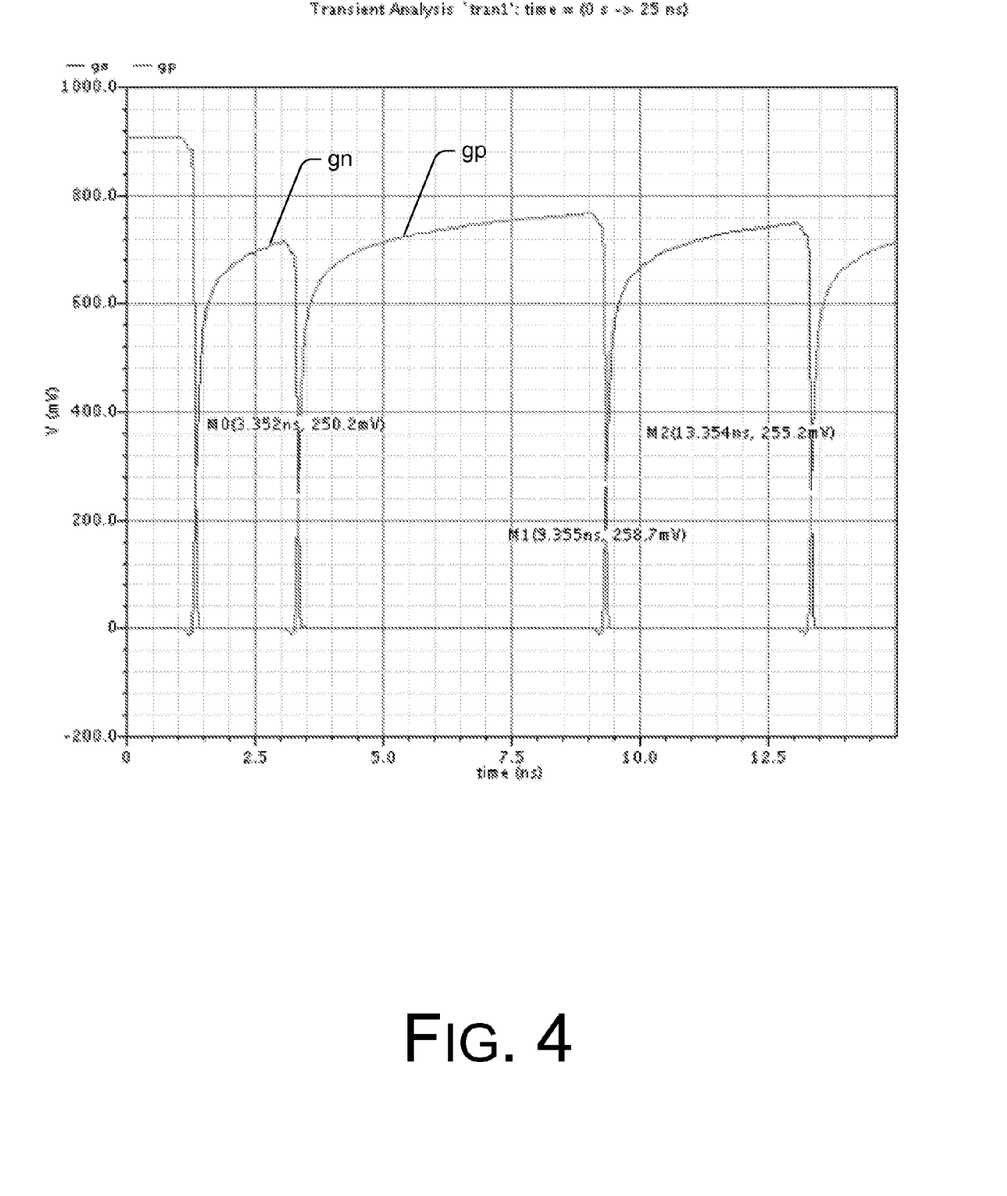
FIG. 4 is a timing diagram that shows the effect of sequence duty cycle on switching time when buffering with a NMOS field effect transistor-based buffer in accordance with an embodiment of the present disclosure.

FIG. 3 illustrates results of simulations showing a comparison of switching of an un-buffered latch and that of a buffered latch in accordance with an embodiment of the present disclosure. FIG. 4 illustrates the effect of sequence duty cycle on switching time when buffering with a NMOS field effect transistor-based buffer in accordance with an embodiment of the present disclosure. The detailed description that follows refers to FIGS. 3 and 4.

FIG. 3 depicts the differential output voltages of the latches, gd=gp−gn. As can be seen, the slope of a buffered latch, such as the latch circuit 100, is advantageously approximately three times faster than that of an un-buffered latch. As apparent in FIG. 3, settling of the NMOS buffer is quite slow on rising, and full settling may not be reached before the end of the clock period. However it does not cause any problem for the PMOS differential pair in the unit current cell to be fully conducted because each of PMOS transistor 212, 214, considering the size, only needs small voltage difference (e.g., 0.2V) across the respective gate of PMOS transistor 212, 214 for 99.9% current switching.

As shown in FIG. 4, the initial voltage variation is much smaller than with infinite/single clock cycle sequence. In the simulations, less than 50 mV in voltage variation is observed. Such reduced variation on initial voltage in turn results in reduced timing variations. In the simulations less than 3 ps in timing variation is observed.

Additional Notes

In the above description of exemplary implementations, for purposes of explanation, specific numbers, materials configurations, and other details are set forth in order to better explain the techniques of the present disclosure, as claimed. However, it will be apparent to one skilled in the art that the embodiments may be practiced using different details than the exemplary ones described herein. In other instances, well-known features are omitted or simplified to clarify the description of the exemplary implementations.

The described exemplary implementations are primarily examples. They are not intended to limit the scope of the appended claims. Rather, the claimed subject matter might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

For the purposes of this disclosure and the claims that follow, the terms "coupled" and "connected" may have been used to describe how various elements interface. Such described interfacing of various elements may be either direct or indirect.

Although specific embodiments of the present disclosure have been disclosed, it will be understood by those of ordinary skill in the art that the foregoing and other variations in form and details may be made therein without departing from the spirit and the scope of the present disclosure. The scope of the present disclosure is defined by the claims provided herein.

What is claimed is:

1. A digital-to-analog converter (DAC), comprising:
   a latch circuit comprising:
      an n-type metal-oxide-semiconductor (NMOS) field effect transistor-based buffer, the latch circuit capable of receiving a first digital signal and a clock signal and outputting a second digital signal through the NMOS field effect transistor-based buffer according to the clock signal, the second digital signal being associated with the first digital signal; and
      a latch that receives the first digital signal and the clock signal and outputs, according to the clock signal, the first digital signal and an inverse first digital signal that is an inverse of the first digital signal,
      wherein the NMOS field effect transistor-based buffer is coupled to receive the first digital signal and the inverse first digital signal from the latch and output a buffered first digital signal and a buffered inverse first digital signal that is an inverse of the buffered first digital signal, one of the buffered first digital signal and the buffered inverse first digital signal being the second digital signal; and
   a unit cell circuit, coupled to the latch circuit, that receives the second digital signal and outputs an analog signal representative of the first digital signal.

2. The DAC as recited in claim 1, wherein the NMOS field effect transistor-based buffer comprises:
   a first stack of NMOS transistors having a first NMOS transistor and a second NMOS transistor coupled in series such that a drain terminal of the first NMOS transistor is connected to a source terminal of the second NMOS transistor, with a source terminal of the first NMOS transistor being coupled to the first voltage source and a drain terminal of the second NMOS transistor being coupled to the second voltage source, a voltage level of the first voltage source being different from a voltage level of the second voltage source; and
   a second stack of NMOS transistors having a third NMOS transistor and a fourth NMOS transistor coupled in series where a drain terminal of the third NMOS transistor is connected to a source terminal of the fourth NMOS transistor, with a source terminal of the third NMOS transistor being coupled to the first voltage source and a drain terminal of the fourth NMOS transistor being coupled to the second voltage source, wherein:
      a gate terminal of the first NMOS transistor and a gate terminal of the fourth NMOS transistor are connected to each other and coupled to receive the inverse first digital signal from the latch;

a gate terminal of the second NMOS transistor and a gate terminal of the third NMOS transistor are connected to each other and coupled to receive the first digital signal from the latch;

a first node coupled to a drain terminal of the first NMOS transistor and a source terminal of the second NMOS transistor to output the buffered first digital signal; and a second node coupled to a drain terminal of the third NMOS transistor and a source terminal of the fourth NMOS transistor to output the buffered inverse first digital signal.

3. The DAC as recited in claim 1, wherein the unit cell circuit comprises a pair of differential p-type metal-oxide-semiconductor (PMOS) field effect transistors, including:
a first PMOS transistor having:
a source terminal coupled to a current source,
a drain terminal coupled to a first load, and
a gate terminal coupled to receive the buffered first digital signal; and
a second PMOS transistor having:
a source terminal coupled to the current source,
a drain terminal coupled to a second load, and
a gate terminal coupled to receive the buffered inverse first digital signal.

4. The DAC as recited in claim 1 further comprising:
a thermometric decoder circuit that receives an n-bit binary code to accordingly output the first digital signal to the latch circuit.

5. A digital-to-analog converter (DAC), comprising:
a thermometric decoder circuit that receives an n-bit binary code to accordingly output a plurality of digital signals representative of the n-bit binary code; and
a plurality of unit cell circuits, at least one of the plurality of unit cell circuits comprising:
a latch circuit coupled to receive clock signal and a respective one of the plurality of digital signals as a first digital signal, the latch circuit having an n-type metal-oxie-semiconductor (NMOS) field effect transistor-based buffer that outputs a buffered first digital signal and a buffered inverse first digital signal as an inverse of the buffered first digital signal, according to the clock signal; and
a pair of differential p-type metal-oxide-semiconductor (PMOS) field effect transistors having a first PMOS transistor switched on or off according to the buffered first digital signal and a second PMOS transistor switched on or off according to the buffered inverse first digital signal such that the pair of differential PMOS transistors output an analog signal representative of the respective one of the plurality of digital signals from the thermometric decoder circuit.

6. The DAC as recited in claim 5, wherein the latch circuit comprises:
a latch that receives the clock signal and the respective one of the plurality of digital signals from the thermometric decoder circuit as the first digital signal and outputs, according to the clock signal, the first digital signal and an inverse first digital signal that is an inverse of the first digital signal; and
the NMOS field effect transistor-based buffer, coupled to receive the first digital signal and the inverse first digital signal from the latch, that outputs a buffered first digital signal and a buffered inverse first digital signal that is an inverse of the buffered first digital signal, one of the buffered first digital signal and the buffered inverse first digital signal being the second digital signal.

7. The DAC as recited in claim 6, wherein the NMOS field effect transistor-based buffer comprises:
a first stack of NMOS transistors having a first NMOS transistor and a second NMOS transistor coupled in series where a drain terminal of the first NMOS transistor is connected to a source terminal of the second NMOs transistor, with a source terminal of the first NMOS transistor being coupled to the first voltage source and a drain terminal of the second NMOS transistor being coupled to the second voltage source, a voltage level of the first voltage source being different from a voltage level of the second voltage source; and
a second stack of NMOS transistors having a third NMOS transistor and a fourth NMOS transistor coupled in series where a drain terminal of the third NMOS transistor is connected to a source terminal of the fourth NMOS transistor, with a source terminal of the third NMOS transistor being coupled to the first voltage source and a drain terminal of the fourth NMOS transistor being coupled to the second voltage source, wherein:
a gate terminal of the first NMOS transistor and a gate terminal of the fourth NMOS transistor are connected to each other and coupled to receive the inverse first digital signal from the latch;
a gate terminal of the second NMOS transistor and a gate terminal of the third NMOS transistor are connected to each other and coupled to receive the first digital signal from the latch;
a first node coupled to a drain terminal of the first NMOS transistor and a source terminal of the second NMOS transistor to output the buffered first digital signal; and
a second node coupled to a drain terminal of the third NMOS transistor and a source terminal of the fourth NMOS transistor to output the buffered inverse first digital signal.

8. A digital-to-analog converter (DAC), comprising:
a unit cell that includes a pair of differential p-type metal-oxide-semiconductor (PMOS) field effect transistors coupled between a current source and a load, the pair of differential PMOS transistors including a first PMOS transistor and a second PMOS transistor such that when the first and second PMOS transistors are driven by a pair of complementary signals the pair of differential PMOS transistors outputs a corresponding analog signal;
a latch circuit that receives and latches a digital signal and outputs, according to a clock signal, a pair of complementary digital signals corresponding to the latched digital signal; and
a buffering circuit, coupled between the latch circuit and the pair of differential PMOS transistors, that buffers the pair of complementary digital signals and outputs a pair of equivalently fast rising and fast falling complementary signals that simultaneously drive the first and second PMOS transistors and output the analog signal.

9. The DAC as recited in claim 8, wherein the buffering circuit comprises an n-type metal-oxide-semiconductor (NMOS) field effect transistor-based buffer that buffers the pair of complementary digital signals from the latch circuit and outputs the pair of equivalently fast rising and fast falling complementary signals.

10. The DAC as recited in claim 9, wherein the NMOS field effect transistor-based buffer comprises:
a first stack of NMOS transistors having a first NMOS transistor and a second NMOS transistor coupled in series and between a first voltage source and a second voltage source, a voltage level of the first voltage source being different from a voltage level of the second voltage source; and a second stack of NMOS transistors having a third NMOS transistor and a fourth NMOS transistor coupled in series between the first voltage source and the second voltage source, such that:

a source terminal of the first NMOS transistor is coupled to the first voltage source and a drain terminal of the second NMOS transistor is coupled to the second voltage source;

a source terminal of the third NMOS transistor is coupled to the first voltage source and a drain terminal of the fourth NMOS transistor is coupled to the second voltage source;

a gate terminal of the second NMOS transistor and a gate terminal of the third NMOS transistor are cross-connected and coupled to receive a first digital signal of the pair of complementary digital signals from the latch;

a gate terminal of the first NMOS transistor and a gate terminal of the fourth NMOS transistor are cross-connected and coupled to receive an inverse first digital signal of the pair of complementary digital signals from the latch;

a first node coupled to a drain terminal of the first NMOS transistor and a source terminal of the second NMOS transistor to output a buffered first digital signal of the pair of equivalently fast rising and fast falling complementary signals; and a second node coupled to a drain terminal of the third NMOS transistor and a source terminal of the fourth NMOS transistor to output a buffered inverse first digital signal of the pair of equivalently fast rising and fast falling complementary signals.

11. The DAC as recited in claim 8, wherein the latch circuit comprises a gated D latch.

12. The DAC as recited in claim 8 further comprising:

a thermometric decoder circuit that receives an n-bit binary code and outputs the digital signal to the latch circuit.

* * * * *